(12) United States Patent
Kwok et al.

(10) Patent No.: US 7,005,361 B2
(45) Date of Patent: Feb. 28, 2006

(54) PROVIDING HIGH PRECISION RESISTANCE IN AN INTEGRATED CIRCUIT USING A THIN FILM RESISTOR OF CONTROLLED DIMENSION

(75) Inventors: Siang Ping Kwok, Dallas, TX (US); Eric W. Beach, Tucson, AZ (US); Philipp Steinmann, Munich (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/875,846

(22) Filed: Jun. 24, 2004

(65) Prior Publication Data

US 2004/0227614 A1    Nov. 18, 2004

Related U.S. Application Data

(62) Division of application No. 10/271,495, filed on Oct. 15, 2002, now abandoned.

(51) Int. Cl.
*H01L 21/4763* (2006.01)

(52) U.S. Cl. .................................... 438/384

(58) Field of Classification Search .............. 257/379, 257/536, 537; 438/238, 382, 384, 674; 427/102; 338/307
See application file for complete search history.

(56) References Cited

U.S. PATENT DOCUMENTS

| | | | |
|---|---|---|---|
| 4,767,721 A | 8/1988 | Liao et al. | |
| 5,420,063 A | 5/1995 | Maghsoudnia et al. | |
| 5,547,896 A | 8/1996 | Linn et al. | |
| 5,670,820 A | 9/1997 | Campbell et al. | |
| 5,905,427 A | 5/1999 | Hamasaki et al. | |
| 6,165,862 A | 12/2000 | Ishikawa et al. | |
| 6,228,735 B1 | 5/2001 | Lee | |
| 6,400,252 B1 | 6/2002 | Smith et al. | |
| 6,426,268 B1 | 7/2002 | Huppert et al. | |
| 6,441,447 B1 * | 8/2002 | Czagas et al. | 257/379 |
| 2001/0029080 A1 | 10/2001 | Ohkawa et al. | |
| 2003/0030107 A1 | 2/2003 | Zekeriya et al. | |

FOREIGN PATENT DOCUMENTS

| | | |
|---|---|---|
| EP | 0 392 642 A1 | 10/1990 |
| WO | WO 200106547 A1 | 1/2001 |

* cited by examiner

*Primary Examiner*—Stephen W. Smoot
(74) *Attorney, Agent, or Firm*—Jacqueline J. Garner; W. James Brady, III; Frederick J. Telecky, Jr.

(57) ABSTRACT

In one embodiment, an integrated circuit includes a thin film resistor, which includes a resistor material that has been deposited on a substrate surface within a channel defined by opposing first and second portions of a stencil structure formed on the substrate surface, the resistor material having an initial width determined by a width of the channel. The stencil structure has been adapted to receive a planarizing material that protects against reduction of the initial width of the resistor material during subsequent process steps for removing the stencil structure. A head mask overlays an end portion of the thin film resistor and a dielectric overlays the head mask, the dielectric defining a via formed in the dielectric above a portion of the head mask. A conductive material has been deposited in the via, coupled to the portion of the head mask and electrically connecting the thin film resistor to other components of the integrated circuit.

11 Claims, 8 Drawing Sheets

FIG. 5s

PROVIDING HIGH PRECISION RESISTANCE IN AN INTEGRATED CIRCUIT USING A THIN FILM RESISTOR OF CONTROLLED DIMENSION

This is a divisional application of Ser. No. 10/271,495 filed Oct. 15, 2002 now abandoned.

TECHNICAL FIELD OF THE INVENTION

This invention relates generally to integrated circuits, and more particularly to providing high precision resistance in an integrated circuit using a thin film resistor of controlled dimension.

BACKGROUND OF THE INVENTION

Thin film resistors are often used in precision analog-to-digital and digital-to-analog integrated circuits for precision data conversion, which may require precise control of the resistance of the thin film resistor over the operating temperatures. Often the final fine control of the resistance of these precision thin film resistors must be done using laser trimming. For certain integrated circuits, such as high-speed and/or high-frequency precision circuits for example, a low resistivity material may be required to, for example: reduce the resistive-capacitive (RC)-time constant of the integrated circuit; minimize the thickness of the thin film resistor for ease of laser trimming; and reduce the integrated circuit area for low cost. A widely used thin film resistor may be formed, for example, from a deposited layer of nickel and chromium alloy and defined using wet chemical etching to remove unwanted thin film resistor material. Such wet etching techniques are used because currently the thin film resistor material may not be removable using dry etching techniques suitable for large-scale manufacturing of integrated circuits. However, such wet etching techniques may suffer from dimension control problems such as etch-back or undercutting of the thin film resistor body, resulting in undesirable width reduction and variation in overall width of the thin film resistor body. Because the width of the thin film resistor can substantially affect the resistance of the thin film resistor, such dimension control problems may impair the ability to construct thin film resistors having a precise resistance and may result in yield losses during manufacturing of precision integrated analog circuits incorporating such thin film resistors.

SUMMARY OF THE INVENTION

According to the present invention, disadvantages and problems associated with previous techniques for defining thin film resistors for integrated circuits may be reduced or eliminated.

In one embodiment of the present invention, an integrated circuit includes a thin film resistor, which includes a resistor material that has been deposited on a substrate surface within a channel defined by opposing first and second portions of a stencil structure formed on the substrate surface, the resistor material having an initial width determined by a width of the channel. The stencil structure has been adapted to receive a planarizing material that protects against reduction of the initial width of the resistor material during subsequent process steps for removing the stencil structure. A head mask overlays an end portion of the thin film resistor and a dielectric overlays the head mask, the dielectric defining a via formed in the dielectric above a portion of the head mask. A conductive material has been deposited in the via, coupled to the portion of the head mask and electrically connecting the thin film resistor to other components of the integrated circuit.

Particular embodiments of the present invention may provide one or more technical advantages. For example, certain embodiments may provide the ability to more uniformly and precisely control the width of the thin film resistor relative to previous techniques. The etch-back or undercutting of the thin film resistor associated with wet etching may be significantly reduced or eliminated completely, resulting in decreased width reduction and decreased variation in the overall width of the thin film resistor. In certain embodiments, for example, the thin film resistor has a final width of less than approximately 2 $\mu$m and the minimum width reduction of the thin film resistor may be scaled down to less than approximately 0.1 $\mu$m, less than approximately 0.05 $\mu$m, less than approximately 0.02 $\mu$m, or better. Improved dimension control may allow thin film resistors having more precise resistance to be constructed for precision analog integrated circuits having a reduced minimum thin film resistor width, possibly reducing the overall size of these integrated circuits. Additionally, at least some of these advantages may be achieved in certain embodiments without an additional masking step associated with previous techniques and, instead, with merely non-critical alignment and dimension control patterning steps.

Systems and methods incorporating one or more of these or other technical advantages may be well suited for modern integrated circuit fabrication. Certain embodiments of the present invention may provide all, some, or none of the above advantages. Certain embodiments may provide one or more other technical advantages, one or more of which may be readily apparent to those skilled in the art from the figures, descriptions, and claims included herein.

BRIEF DESCRIPTION OF THE DRAWINGS

For a more complete understanding of the present invention and the advantages thereof, reference is now made to the following descriptions, taken in conjunction with the accompanying drawings in which.

DESCRIPTION OF EXAMPLE EMBODIMENTS

Figure 1A:
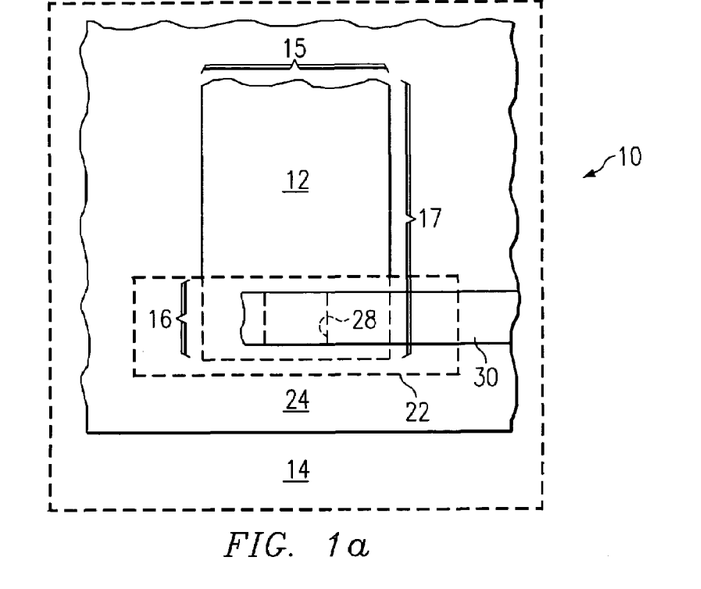
FIGS. 1A and 1B illustrate top and cross-sectional side views of a portion of an example integrated circuit incorporating a thin film resistor of controlled dimension.
Figure 1B:
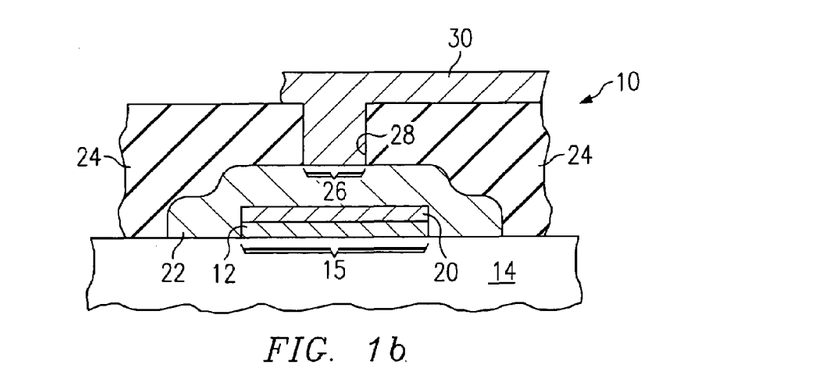

FIGS. 1A and 1B illustrate top and cross-sectional side views of a portion of an example integrated circuit 10 incorporating a thin film resistor 12 of controlled dimension. Integrated circuit 10 may be any suitable type of integrated circuit, for example, a high precision analog integrated circuit. Thin film resistor 12 is deposited on a silicon dioxide or other dielectric material 14, below which lies silicon of integrated circuit 10. Thin film resistor 12 may include an alloy of nickel and chromium, an alloy of NiCr and aluminum, or any other material suitable for use as a thin film resistor. In a particular embodiment, thin film resistor 12 may be approximately 100 Å thick, although the present invention contemplates thin film resistor 12 having any suitable thickness according to particular needs. The length and width may be determined to provide a desired resistance of thin film resistor 12 for operation within integrated circuit 10. In particular, it may be desirable to precisely control width 15 of thin film resistor 12. The present invention contemplates thin film resistor 12 having any suitable width 15 according to particular needs.

Thin film resistor 12 includes first and second end portions 16, of which only one is shown. A hard mask material 20 may be deposited on and substantially cover a body portion 17 of thin film resistor 12, serving as a hard mask that substantially prevents body portion 17 of thin film resistor 12 from being etched and protects body portion 17 of thin film resistor 12 against diffusion of other materials and contaminates such as planarizing materials into thin film resistor 12. After body portion 17 of thin film resistor 12, which is covered with hard mask material 20, has been formed according to the methods of the present invention, hard mask material 20 may include an alloy of titanium and tungsten or any other material suitable for protecting body portion 17 of thin film resistor 12 against seepage of other materials into thin film resistor 12. A head mask material 22 such as aluminum, copper, or any other suitable material may cover end portion 16 of thin film resistor 12. In one embodiment, head mask material 22 is approximately 2500 Å thick over end portion 16 of thin film resistor 12. A dielectric material 24 may cover a portion of head mask material 22 and define a via 28 formed in dielectric material 24 above an uncovered portion 26 of head mask material 22. Dielectric material 24 may include silicon dioxide or any other suitable material. A conductive material 30 may be deposited in via 28 and coupled to uncovered portion 26 of head mask material 22 to electrically connect thin film resistor 12 to one or more other components of integrated circuit 10. Conductive material 30 may include aluminum, copper, or any other suitable material. In one embodiment, conductive material 30 and head mask material 22 include substantially similar materials.

Formation of thin film resistor 12 according to the present invention may, in particular embodiments, provide one or more technical advantages. For example, certain embodiments of the present invention may provide the ability to more uniformly and precisely control width 15 of thin film resistor 12 relative to previous techniques. The etch-back or undercutting of thin film resistor 12 associated with wet etching may be significantly reduced or eliminated completely, resulting in decreased width reduction and decreased variation in overall width 15 of thin film resistor 12. In certain embodiments, for example, thin film resistor 12 has a final width of less than approximately 2 $\mu$m and a minimum width 15 reduction that may be scaled down to less than approximately 0.1 $\mu$m, less than approximately 0.05 $\mu$m, less than approximately 0.02 $\mu$m, or better. Improved dimension control may allow thin film resistors 12 having more precise resistance to be constructed for precision analog integrated circuits having a reduced minimum width 15 of thin film resistor 12, possibly reducing the overall size of these integrated circuits. Additionally, at least some of these advantages may be achieved in certain embodiments without an additional masking step associated with previous techniques and, instead, with merely non-critical alignment and dimension control patterning steps.

Figure 2:
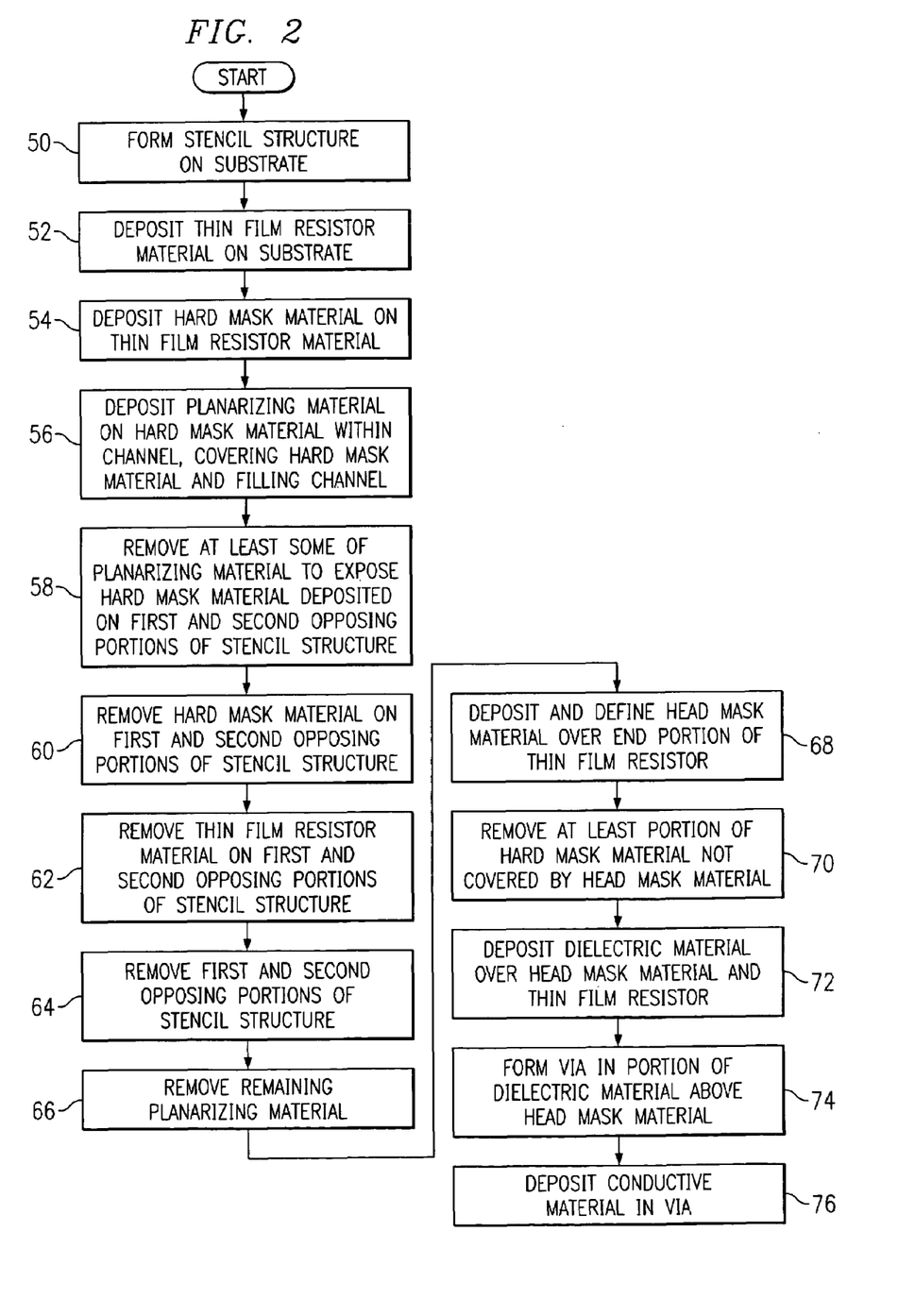
FIG. 2 illustrates an example method for constructing a thin film resistor of controlled dimension for an integrated circuit.

FIG. 2 illustrates an example method for constructing thin film resistor 12 of controlled dimension for integrated circuit 10. At step 50, a stencil structure is formed on substrate surface 14, the stencil structure including one or more layers and defining a channel separating first and second opposing portions of the stencil structure.

Figure 3:
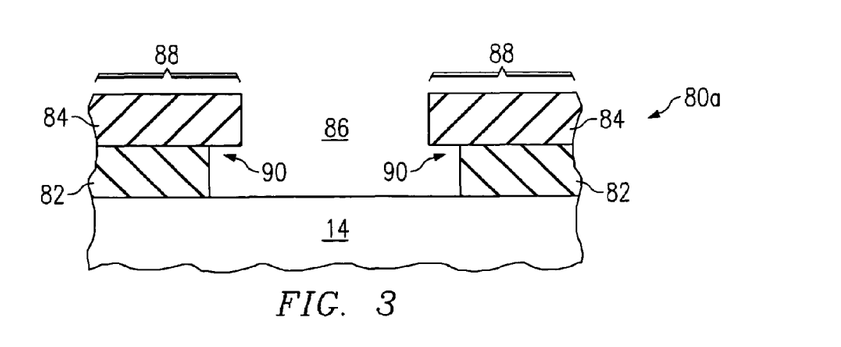
FIG. 3 illustrates an example stencil structure having a lipped profile.
Figure 4:
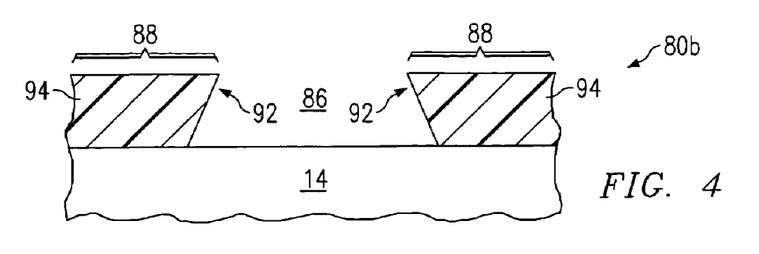
FIG. 4 illustrates an example stencil structure having an angled profile.

For example, referring to FIG. 3, the stencil structure may be a lipped stencil structure 80a having a lipped profile. Lipped stencil structure 80a may be formed on substrate surface 14 and may include a first stencil structure layer 82, a second stencil structure layer 84, and a channel 86 separating opposing first and second portions 88 of stencil structure 80a, each portion 88 having a lipped profile 90 such that channel 86 is wider at the level of first stencil structure layer 82 than at the level of second stencil structure layer 84. In one embodiment, first stencil structure layer 82 may include an oxide, phosphorous silicate glass (PSG), undoped silicate glass (USG), or any other suitable material, and second stencil structure layer 84 may include a nitride, USG, or any other suitable material. As another example, referring to FIG. 4, the stencil structure may be an angled stencil structure 80b having an angled profile. Angled stencil structure 80b may be formed on substrate 14 and may include a single layer of a negative resist material 94. A channel 86 separating first and second opposing portions 88 of stencil structure 80b, each portion having an angled profile 92 such that channel 86 is wider at the bottom than at the top. FIGS. 3 and 4 illustrate example stencil structures 80 only. Although the remainder of the example method is described with reference to lipped stencil structure 80a, those skilled in the art will appreciate that any suitable stencil structure may be used without departing from the intended scope of the present invention.

Returning to FIG. 2, at step 52, the thin film resistor material is deposited on the surface of substrate 14, with at least some of the thin film resistor material being deposited as desired within channel 86 to define thin film resistor 12. Some of the thin film resistor material may also be deposited outside of channel 86 on first and second opposing portions 88 of stencil structure 80. In one embodiment, the thin film resistor material is deposited using collimated beams directed substantially perpendicular to the surface of substrate 14. At step 54, hard mask material 20 may be deposited on thin film resistor 12 within channel 86 as desired, substantially covering thin film resistor 12. Some hard mask material 20 may also be deposited outside of channel 86 on first and second opposing portions 88 of stencil structure 80, including any thin film resistor material previously deposited on opposing portions 88. In one embodiment, hard mask material 20 is deposited using collimated beams, which include hard mask material 20 and are directed substantially perpendicular to the surface of substrate 14. At step 56, a planarizing material is deposited on hard mask material 20 within channel 86, the planarizing material substantially filling channel 86 to cover and isolate thin film resistor 12 and hard mask material 20 within channel 86. The planarizing material may also substantially cover first and second opposing portions 88 of stencil structure 80, including any thin film resistor material and hard mask material 20 previously deposited on opposing portions 88.

At step 58, at least some of the planarizing material is removed to expose hard mask material 20 deposited outside of channel 86 on first and second opposing portions 88 of stencil structure 80. Hard mask material 20 deposited on thin film resistor 12 within channel 86 remains substantially covered by the planarizing material. At step 60, hard mask material 20 deposited on first and second opposing portions 88 of stencil structure 80 is removed and, at step 62, the thin film resistor material deposited on first and second opposing portions 88 of stencil structure 80 is removed. Hard mask material 20 and thin film resistor material deposited on first and second opposing portions 88 of stencil structure 80 may be removed using conventional wet etching techniques, the planarizing material within channel 86 protecting thin film resistor 12 against undesirable etch-back and undercutting and thus from undesirable width reduction. At step 64, first and second opposing portions 88 of stencil structure 80 are removed, leaving thin film resistor 12, hard mask material 20 deposited on thin film resistor 12, and the planarizing material deposited on hard mask material 20 within channel 86 (now resembling an exposed plug) remaining. At step 66, the remaining planarizing material is removed, for example, using conventional techniques.

At step 68, head mask material 22 is deposited over end portion 16 of thin film resistor 12, substantially covering end portion 16 of thin film resistor 12 (and thus hard mask material 20 deposited on end portion 16 of thin film resistor 12). At step 70, at least a portion of hard mask material 20 not covered by head mask material 22 is removed, for example, using conventional techniques. In one embodiment, the portion of hard mask material 20 removed is sufficient to expose the entire portion of thin film resister 12 not covered by head mask material 22. Dielectric material 24 may be deposited over head mask material 22 and thin film resistor 12 at step 72 and, at step 74, a via 28 may be formed in dielectric material 24 above head mask material 22 to define uncovered portion 26 of head mask material 22. At step 76, conductive material 30 may be deposited in via 28 and coupled to uncovered portion 26 of head mask material 22 to electrically connect thin film resistor 12 to one or more other components of integrated circuit 10, and the method ends.

Figure 5A:
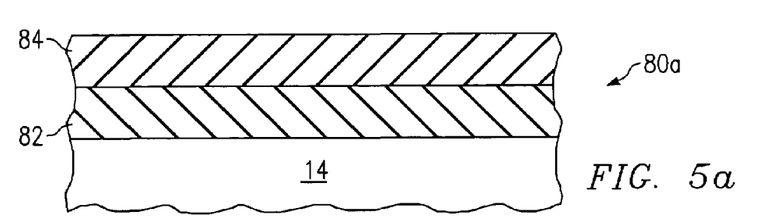
FIGS. 5A–5S illustrate an example process for constructing a thin film resistor using a stencil structure having a lipped profile.
Figure 5B:
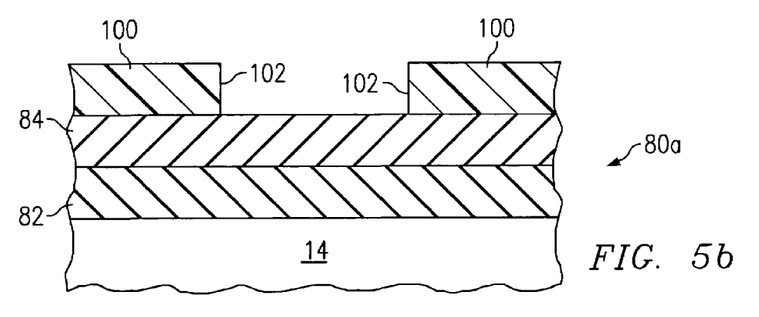

FIGS. 5A–5S illustrate an example process for constructing a thin film resistor 12 using a lipped stencil structure 80a. Although the illustrated example involves a lipped stencil structure 80a, angled stencil structure 80b or any other suitable stencil structure may be used according to particular needs. As shown in FIG. 5A, to form lipped stencil structure 80a, first stencil structure layer 82 is deposited on substrate 14 and second stencil structure layer 84 is deposited on first stencil structure layer 82. As shown in FIG. 5B, a resist 100 is placed on second stencil structure layer 84 and patterned so as to define interior walls 102. In one embodiment, resist 100 is a positive or negative photoresist patterned using a suitable lithographic masking process.

Figure 5C:
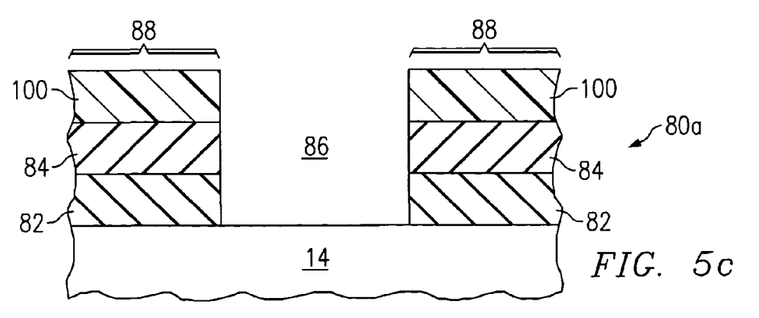
Figure 5D:
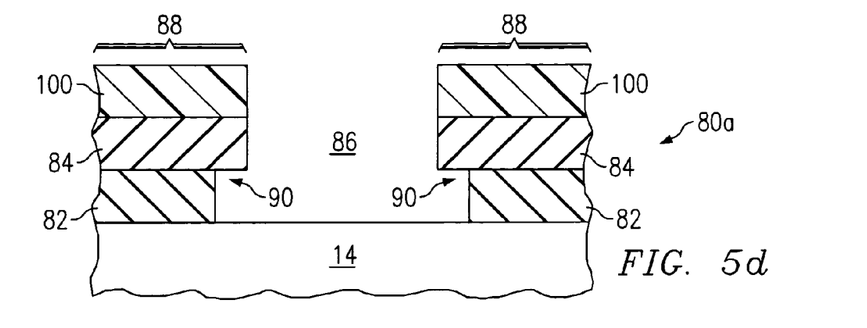
Figure 5E:
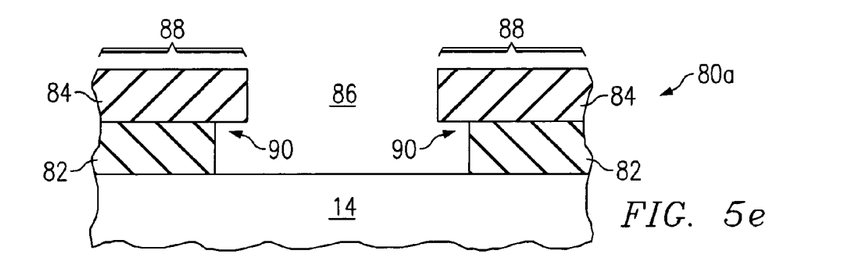

As shown in FIG. 5C, channel 86 is formed in first stencil structure layer 82 and second stencil structure layer 84 separating first and second opposing portions 88 of stencil structure 80a. Channel 86 may be formed using a dry etching process or any other suitable etching process. As shown in FIG. 5D, lipped profile 90 may be formed using an etching process that is selective to the material of first stencil structure layer 82 relative to the material of second stencil structure layer 84, such that first stencil structure layer 82 is etched at a faster rate than second stencil structure layer 84. The etching process used to form lipped profile 90 may include exposing stencil structure 80a to a vapor containing hydrofluoric acid (commonly referred to as an "HF" process). As an example, if first stencil structure layer 82 includes a PSG or USG oxide and second stencil structure layer 84 includes a USG oxide or a nitride, it may be preferable to expose lipped stencil structure 80a to a dilute hydrofluoric vapor or acid to form lipped profile 90. As shown in FIG. 5E, resist 100 is removed from lipped stencil structure 80a using, for example, a lift-off technique such as a standard ashing technique. Lipped stencil structure 80a now includes first stencil structure layer 82, second stencil structure layer 84, and channel 86 separating opposing first and second portions 88, each portion 88 including lipped profile 90 such that such that channel 86 is wider at the level of first stencil structure layer 82 than at the level of second stencil structure layer 84.

Figure 5F:
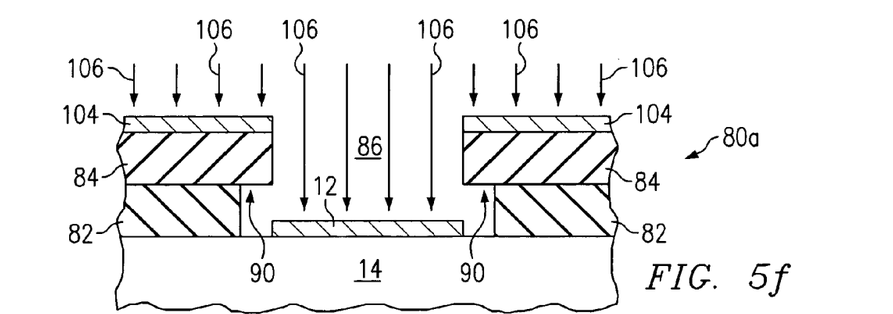

As shown in FIG. 5F, the thin film resistor material is deposited on lipped stencil structure 80a, at least some of the thin film resistor material being deposited on the surface of substrate 14 within channel 86 to define thin film resistor 12. A portion of the thin film resistor material 104 may also be deposited outside of channel 86 on first and second opposing portions 88 of lipped stencil structure 80a. The width of channel 86 at or near the bottom of second stencil structure layer 84, which may be substantially similar to the width of channel 86 at or near the top of second stencil structure layer 84, may determine width 15 of thin film resistor 12 at the bottom of channel 86. Similarly, in an alternative embodiment in which angled stencil structure 80b is used, the width of channel 86 at or near the top of angled stencil structure 80b may determine width 15 of thin film resistor 12 at the bottom of channel 86. In one embodiment, the thin film resistor material is deposited using collimated beams 106 that include the thin film resistor material and are directed substantially perpendicular to the surface of substrate 14. The use of collimated beams 106 directed substantially perpendicular to the surface of substrate 14, combined with lipped profile 90 of lipped stencil structure 80a, may be preferable to increase the probability that width 15 of thin film resistor 12 is substantially similar to the width of channel 86 at or near second stencil structure layer 84 and that thin film resistor 12 is substantially separated from and does not contact first stencil structure layer 82 within channel 86. As described below, this may help ensure that thin film resistor 12 is substantially isolated from first stencil structure layer 82 when channel 86 is filled with the planarizing material, which may in turn substantially reduce or eliminate etch-back or undercutting of thin film resistor 12 during wet etching to remove stencil structure layers 82 and 84.

Figure 5G:
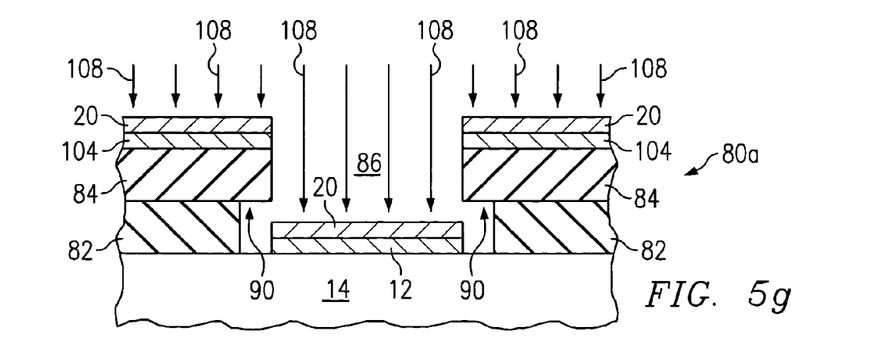

As shown in FIG. 5G, hard mask material 20 may be deposited on thin film resistor 12 within channel 86, substantially covering thin film resistor 12. Hard mask material 20 may also be deposited outside of channel 86 on first and second opposing portions 88 of lipped stencil structure 80, including any thin film resistor material 104 previously deposited on opposing portions 88. In one embodiment, hard mask material 20 is deposited using collimated beams 108 that include hard mask material 20 and are directed substantially perpendicular to the surface of substrate 14. The use of collimated beams 108 directed substantially perpendicular to the surface of substrate 14 may be preferable to increase the probability that hard mask material 20 is substantially separated from and does not contact first stencil structure layer 82 within channel 86. Although hard mask material 20 is described, the present invention contemplates formation of thin film resistor 12 without subsequent deposition of hard mask material 20.

Figure 5H:
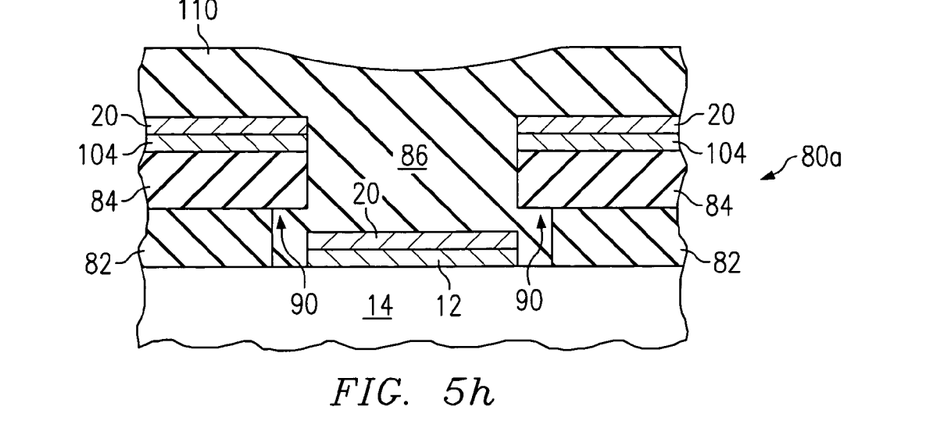
Figure 5I:
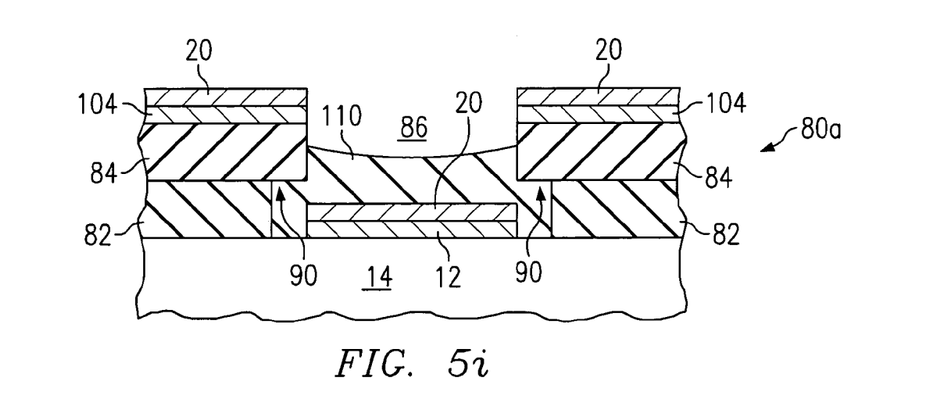

As shown in FIG. 5H, planarizing material 110 is deposited on hard mask material 20 within channel 86, planarizing material 110 substantially filling channel 86 to cover and isolate thin film resistor 12 and hard mask material 20 within channel 86. Planarizing material 110 preferably fills the area within channel 86 below stencil structure layer 84 and between first stencil structure layer 82 and thin film resistor 12 so as to substantially separate thin film resistor 12 from first stencil structure layer 82. Planarizing material 110 may also substantially cover first and second opposing portions 88 of lipped stencil structure 80a outside of channel 86. It may be preferable to minimize formation of a significant recess in the top surface of planarizing material 110 over channel 86, such that planarizing material 110 preferably completely fills channel 86 and the top surface of planarizing material 110 is substantially level. Planarizing material 110 may include polyimide, a photoresist material, a suitable organic material, a plasma oxide, an inorganic dielectric, silicate spin-on glass (SOG) oxide, PC3-1500 manufactured by FUTURREX, INC., or any other suitable material according to particular needs. As shown in FIG. 5I, at least some planarizing material 110 is removed to expose hard mask material 20 deposited outside of channel 86 on first and second opposing portions 88 of lipped stencil structure 80a. Planarizing material 110 may be removed using standard ashing techniques, non-critical reverse-block patterning and etch-back, or any other suitable technique according to particular needs. Hard mask material 20 deposited on thin film resistor 12 within channel 86 remains substantially covered by planarizing material 110. In certain embodiments, planarizing material 110 includes an inorganic dielectric such as plasma-enhanced tetra-ethyl-ortho-silicate (TEOS) or silicon dioxide. In this embodiment, a chemical mechanical polishing (CMP) technique may be used to remove planarizing material 110 to expose hard mask material 20 deposited outside of channel 86 on first and second opposing portions 88 of lipped stencil structure 80a.

Figure 5J:
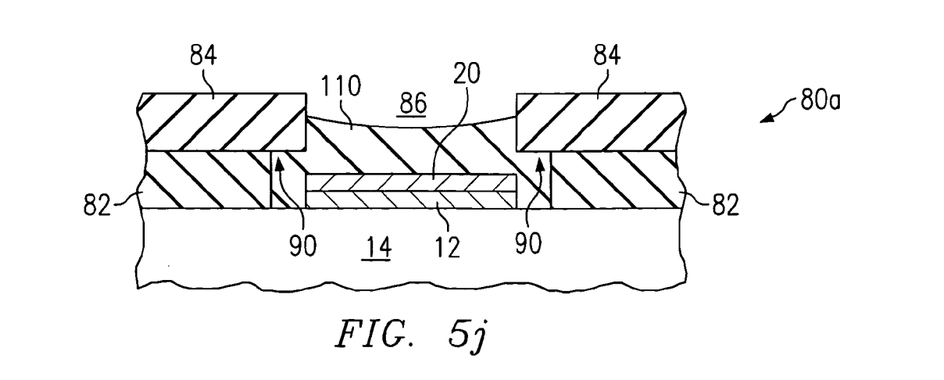

As shown in FIG. 5J, thin film resistor material 104 and hard mask material 20 deposited outside of channel 86 on first and second opposing portions 88 of lipped stencil structure 80a may be removed using standard etching techniques. In one embodiment, thin film resistor material 104 and hard mask material 20 deposited outside of channel 86 are removed using a standard wet etching technique. In an alternative embodiment, a CMP technique may be used to remove thin film resistor material 104 and hard mask material 20 deposited outside of channel 86. For example, if a CMP technique was used to remove planarizing material 110 to expose hard mask material 20 deposited outside channel 86 on first and second opposing portions 88 of lipped stencil structure 80a, the same CMP technique may be continued to remove thin film resistor material 104 and hard mask material 20 deposited outside of channel 86. The first and second opposing portions 88 of lipped stencil structure 80a, thin film resistor 12, hard mask material 20 deposited on thin film resistor 12, and planarizing material 110 deposited on hard mask material 20 within channel 86 remain.

Planarizing material 110 deposited on hard mask material 20 within channel 86 may serve as a protective layer for thin film resistor 12 and hard mask material 20 deposited on thin film resistor 12. This may allow a standard wet etching technique to be used to remove thin film resistor material 104 and hard mask material 20 deposited outside of channel 86, and to remove first and second opposing portions 88 of lipped stencil structure 80a themselves, without exposing thin film resistor 12 or hard mask material 20 to wet etching. Thus, the etch-back or undercutting of thin film resistor 12 associated with wet etching may be significantly reduced or eliminated completely, resulting in decreased or eliminated width reduction and variation in overall width 15 of thin film resistor 12 due to such wet etching. In certain embodiments, for example, thin film resistor 12 has a final width of less than approximately 2 $\mu$m and a minimum width reduction that may be scaled down to less than approximately 0.1 $\mu$m, less than approximately 0.05 $\mu$m, less than approximately 0.02 $\mu$m, or better. Improved dimension control may allow thin film resistors 12 having more precise resistance to be constructed, which may decrease yield losses during manufacturing of high precision analog circuits incorporating such thin film resistors 12. Although wet etching is described, thin film resistor material 104 and hard mask material 20 deposited outside of channel 86 on first and second opposing portions 88 of lipped stencil structure 80a may be removed using any suitable technique.

Figure 5K:
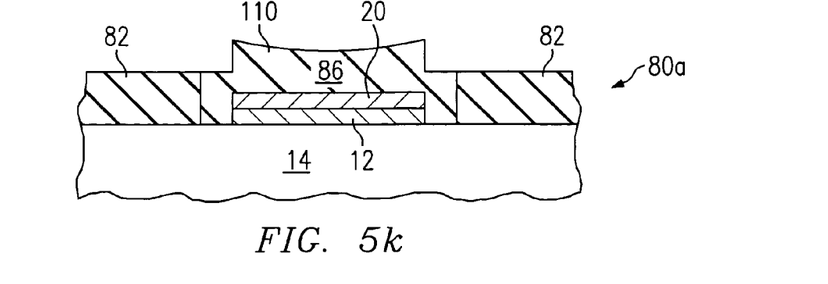
Figure 5L:
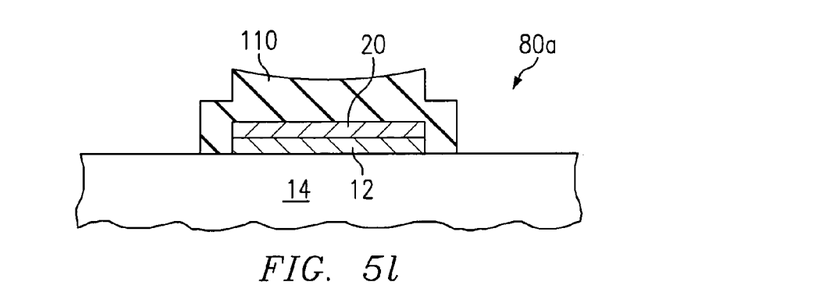
Figure 5M:
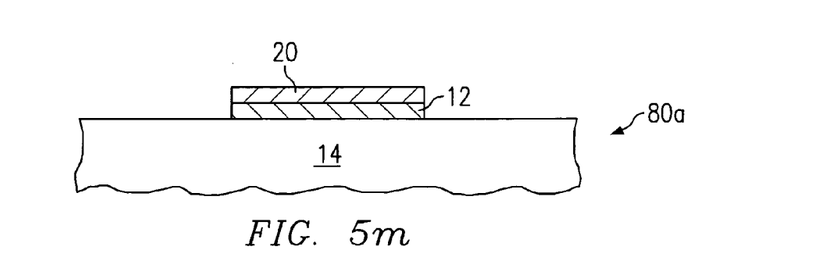

As shown in FIG. 5K, second stencil structure layer 84 may be removed using a plasma strip, dry etch with fluorinated gas, an HF strip, or any other suitable technique. As shown in FIG. 5L, first stencil structure layer 82 may be removed using a hydrofluoric acid wet etch or any other suitable technique. In one embodiment, a CMP technique may be used to remove second stencil structure layer 84. For example, if a CMP technique was used to remove planarizing material 110 to expose hard mask material 20 deposited outside channel 86 on first and second opposing portions 88 of lipped stencil structure 80a and to remove thin film resistor material 104 and hard mask material 20 deposited outside of channel 86, the same CMP technique may be continued to remove second stencil structure layer 84. In an alternative embodiment, if angled stencil structure 80b is used, first and second opposing portions 88 may be removed, for example, using a standard ashing technique. As shown in FIG. 5M, the remaining planarizing material 110 (now resembling an exposed plug) may be removed using a standard ashing technique, solvent strip, or any other suitable technique. Thin film resistor 12 and hard mask material 20 deposited on thin film resistor 12 remain.

Figure 5N:
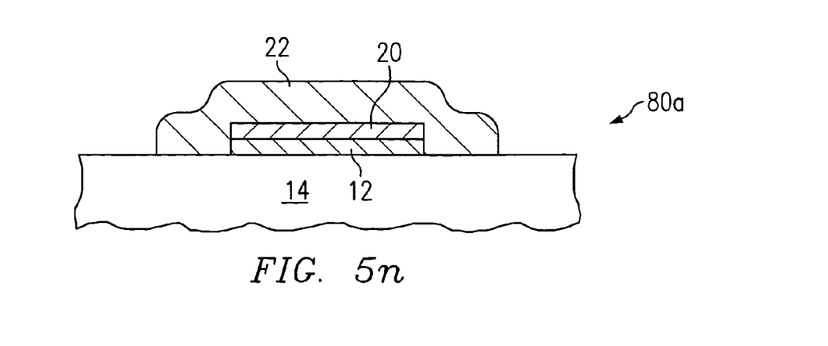
Figure 5O:
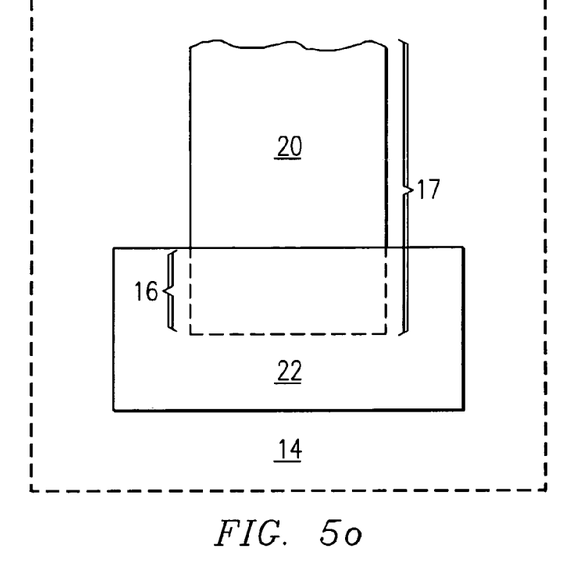
Figure 5P:
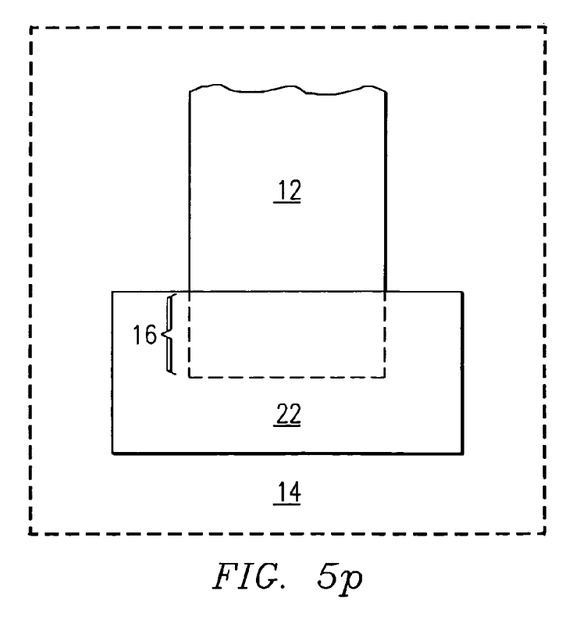

As shown in FIG. 5N, head mask material 22 may be deposited over end portion 16 of thin film resistor 12, substantially covering end portion 16 of thin film resistor 12 (and thus hard mask material 20 deposited on end portion 16 of thin film resistor 12). In one embodiment, approximately 2500 Å of head mask material 22 are deposited over end portion 16 of thin film resistor 12, although head mask material 22 may have any suitable thickness according to particular needs. FIG. 5O illustrates a top view of a portion of integrated circuit 10 having thin film resistor 12 as formed in FIG. 5N. In one embodiment, head mask material 22 is deposited over substantially all of integrated circuit 10 and then etched to expose a portion of hard mask material 20 deposited on thin film resistor 12 between ends 16 of thin film resistor 12. The exposed portion of hard mask material 20 deposited on thin film resistor 12 may serve as a protective layer for thin film resistor 12 during etching of head mask material 22. As shown in FIG. 5P, at least a portion of hard mask material 20 not covered by head mask material 22 is removed, for example, using conventional techniques. In one embodiment, the portion of hard mask material 20 removed is sufficient to expose the entire portion of thin film resistor 12 not covered by head mask material 22. A wet etch, dry etch (e.g., using fluorinated plasma), or other suitable etching technique may be used to remove the portion of hard mask material 20 not covered by head mask material 22.

Figure 5Q:
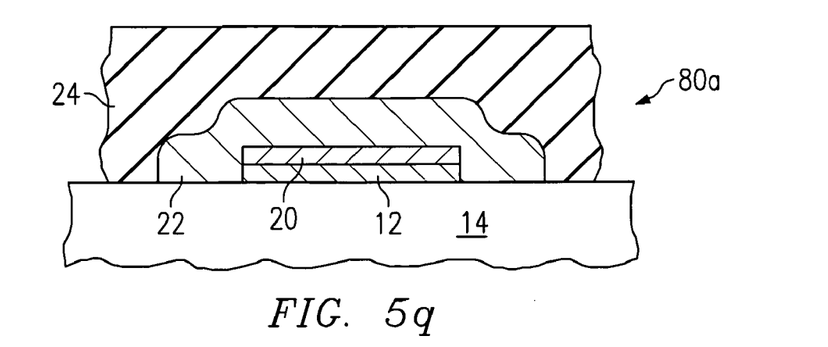
Figure 5R:
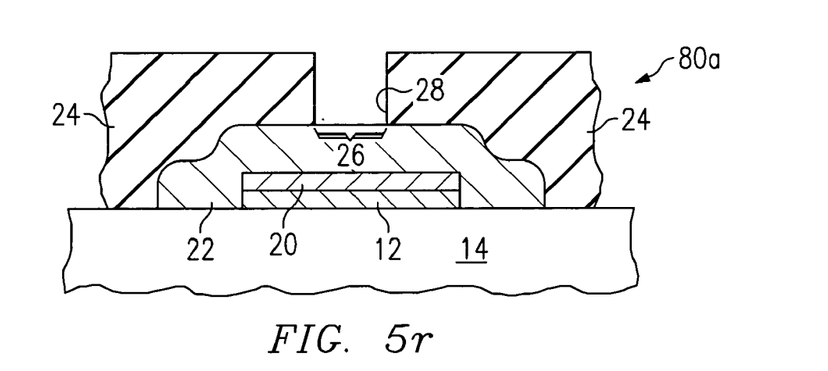

As shown in FIG. 5Q, dielectric material 24 may be deposited over head mask material 22. Dielectric material 24 may include silicon dioxide or any other suitable material. As shown in FIG. 5R, a via 28 may be formed in dielectric material 24 above head mask material 22 to define uncovered portion 26 of head mask material 22. As shown in FIG.

Figure 5S:
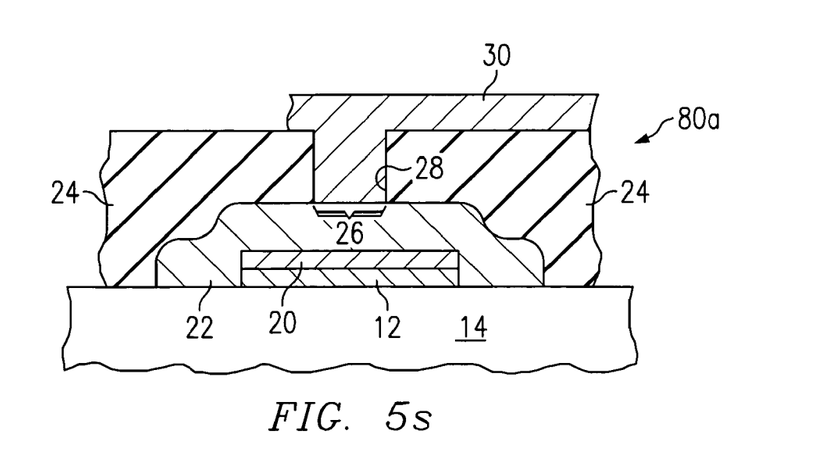

5S, conductive material 30 may be deposited in via 28 and coupled to uncovered portion 26 of head mask material 22 to electrically connect thin film resistor 12 to one or more other components of integrated circuit 10, and the process ends.

Although the present invention has been described with several embodiments, diverse changes, substitutions, variations, alterations, and modifications may be suggested to one skilled in the art, and it is intended that the invention encompass all such changes, substitutions, variations, alterations, and modifications as fall within the spirit and scope of the appended claims.

What is claimed is:

1. A method for constructing a thin film resistor for an integrated circuit, comprising:
    forming a stencil structure on a substrate surface, the stencil structure comprising one or more layers and defining a channel separating first and second opposing portions of the stencil structure;
    depositing a thin film resistor material, some of the thin film resistor material being deposited on the substrate surface within the channel to define the thin film resistor, some of the thin film resistor material being deposited outside the channel on the first and second opposing portions of the stencil structure, the thin film resistor having an initial width determined by a width of the channel;
    depositing a planarizing material within the channel so as to substantially surround the thin film resistor within the channel and protect against reduction of the initial width of the thin film resistor during subsequent process steps for removing the stencil structure from the substrate surface;
    removing at least some of the planarizing material sufficient to expose the thin film resistor material deposited outside the channel on the first and second opposing portions of the stencil structure, the thin film resistor within the channel remaining covered by the planarizing material;
    removing the thin film resistor material deposited outside the channel on the first and second opposing portions of the stencil structure;
    removing the first and second opposing portions of the stencil structure; and
    removing the remaining planarizing material deposited on the thin film resistor within the channel;
    wherein forming the stencil structure on the substrate surface further comprises:
        depositing a first stencil structure layer on the substrate surface; and
        depositing a second stencil structure layer on the first stencil structure layer, the second stencil structure layer comprising a different material than the first stencil structure layer, the second stencil structure layer extending further into the channel than the first stencil structure layer due to preferential etching of the first stencil structure layer relative to the second stencil structure layer, the width of the channel between opposing second stencil structure layers determining the initial width of the thin film resistor.

2. The method of claim 1, wherein the thin film resistor has a final width of less than approximately 2 $\mu$m.

3. The method of claim 1, wherein the thin film resistor has a final width that differs from the initial width of the thin film resistor by less than approximately 0.1 $\mu$m.

4. The method of claim 1, wherein the presence of the planarizing material allows the stencil structure to be removed from the substrate surface using standard wet etching techniques while substantially preventing etch-back or undercutting of the thin film resistor.

5. The method of claim 1, wherein each opposing portion of the stencil structure comprises a negative resist material and is angled from a top of the channel to a bottom of the channel, the top of the channel being narrower than the bottom of the channel, the width of the channel at the top of the channel determining the initial width of the thin film resistor.

6. The method of claim 1, further comprising:
    depositing a head mask material overlaying an end portion of the thin film resistor;
    depositing a dielectric material overlaying the head mask material and defining a via formed in the dielectric material above a portion of the head mask material; and
    depositing a conductive material in the via and coupled to the portion of the head mask material, the conductive material electrically connecting the thin film resistor to one or more other components of the integrated circuit.

7. The method of claim 1, wherein the integrated circuit comprises a high precision analog integrated circuit.

8. A method for constructing a thin film resistor for an integrated circuit, comprising:
    forming a stencil structure on a substrate surface, the stencil structure comprising one or more layers and defining a channel separating first and second opposing portions of the stencil structure;
    depositing a thin film resistor material, some of the thin film resistor material being deposited on the substrate surface within the channel to define the thin film resistor, some of the thin film resistor material being deposited outside the channel on the first and second opposing portions of the stencil structure, the thin film resistor having an initial width determined by a width of the channel;
    depositing a planarizing material within the channel so as to substantially surround the thin film resistor within the channel and protect against reduction of the initial width of the thin film resistor during subsequent process steps for removing the stencil structure from the substrate surface;
    removing at least some of the planarizing material sufficient to expose the thin film resistor material deposited outside the channel on the first and second opposing portions of the stencil structure, the thin film resistor within the channel remaining covered by the planarizing material;
    removing the thin film resistor material deposited outside the channel on the first and second opposing portions of the stencil structure;
    removing the first and second opposing portions of the stencil structure; and
    removing the remaining planarizing material deposited on the thin film resistor within the channel;
    depositing a head mask material overlaying an end portion of the thin film resistor;
    depositing a dielectric material overlaying the head mask material and defining a via formed in the dielectric material above a portion of the head mask material;
    depositing a conductive material in the via and coupled to the portion of the head mask material, the conductive material electrically connecting the thin film resistor to one or more other components of the integrated circuit;
    depositing a hard mask material on substantially all of the thin film resistor within the channel to protect against diffusion of the head mask material into the thin film resistor during operation of the integrated circuit; and removing a portion of the hard mask material such that the hard mask material covers the end portion of the thin film resistor underlying the head mask material.

9. The method of claim 8, wherein:

the thin film resistor material is deposited using first collimated beams comprising the thin film resistor material and directed substantially perpendicular to the substrate surface; and the hard mask material is deposited using second collimated beams comprising a barrier material and directed substantially perpendicular to the substrate surface.

10. The method of claim 8, wherein:

the thin film resistor material comprises an alloy of nickel and chromium;

the hard mask material comprises an alloy of titanium and tungsten;

the planarizing material comprises at least one of polyimide, a photoresist material, an organic material, a plasma oxide, and an inorganic dielectric; and the head mask material and the conductive material comprise at least one of aluminum and copper.

11. A method for constructing a thin film resistor for an integrated circuit, comprising:

forming a stencil structure on a substrate surface, the stencil structure comprising one or more layers and defining a channel separating first and second opposing portions of the stencil structure;

depositing a thin film resistor material, some of the thin film resistor material being deposited on the substrate surface within the channel to define the thin film resistor, some of the thin film resistor material being deposited outside the channel on the first and second opposing portions of the stencil structure, the thin film resistor having an initial width determined b a width of the channel;

depositing a planarizing material within the channel so as to substantially surround the thin film resistor within the channel and protect against reduction of the initial width of the thin film resistor during subsequent process steps for removing the stencil structure from the substrate surface;

removing at least some of the planarizing material sufficient to expose the thin film resistor material deposited outside the channel on the first and second opposing portions of the stencil structure, the thin film resistor within the channel remaining covered by the planarizing material;

removing the thin film resistor material deposited outside the channel on the first and second opposing portions of the stencil structure;

removing the first and second opposing portions of the stencil structure; and removing the remaining planarizing material deposited on the thin film resistor within the channel, wherein removing at least some of the planarizing material sufficient to expose the thin film resistor material deposited outside the channel and removing the thin film resistor material deposited outside the channel comprise using a chemical mechanical polishing (CMP) technique.

* * * * *